(12) United States Patent
Gan et al.

(10) Patent No.: US 6,835,977 B2
(45) Date of Patent: Dec. 28, 2004

(54) VARIABLE CAPACTOR STRUCTURE

(75) Inventors: Jing-Horng Gan, Hsinchu Hsien (TW); Anchor Chen, Pingtung (TW)

(73) Assignee: United Microelectronics Corp., Hsinchu (TW)

( * ) Notice: Subject to any disclaimer, the term of this patent is extended or adjusted under 35 U.S.C. 154(b) by 59 days.

(21) Appl. No.: 10/091,942

(22) Filed: Mar. 5, 2002

(65) Prior Publication Data

US 2003/0168691 A1 Sep. 11, 2003

(51) Int. Cl.⁷ .............................................. H01L 27/108
(52) U.S. Cl. ...................... 257/312; 257/313; 257/532; 257/595; 257/599; 257/600; 257/602
(58) Field of Search ................................ 257/312, 313, 257/532, 595, 599, 600, 602

(56) References Cited

U.S. PATENT DOCUMENTS 5,936,164 A * 8/1999 Sparks et al. .................. 73/724

6,583,495 B2 * 6/2003 Lee et al. ..................... 257/595

FOREIGN PATENT DOCUMENTS

JP          03147375 A  *  6/1991  ........... H01L/29/93

* cited by examiner

*Primary Examiner*—Tom Thomas
*Assistant Examiner*—Matthew E. Warren
(74) *Attorney, Agent, or Firm*—J.C. Patents

(57) ABSTRACT

A variable capacitor comprising a substrate having a first type ion-doped buried layer, a first type ion-doped well, a second type ion-doped region and a conductive layer thereon. The first type ion-doped well is formed within the substrate. The first type ion-doped well has a cavity. The first type ion-doped buried layer is in the substrate underneath the first type ion-doped well. The first type ion-doped buried layer and the first type ion-doped well are connected. The second type ion-doped region is at the bottom of the cavity of the first type ion-doped well. The conductive layer is above and in connection with the first type ion-doped buried layer.

14 Claims, 14 Drawing Sheets

VARIABLE CAPACITOR STRUCTURE

BACKGROUND OF THE INVENTION

1. Field of Invention

The present invention relates to a variable capacitor (varactor) structure and its method of manufacture. More particularly, the present invention relates to a high-frequency variable capacitor structure and its method of manufacture.

2. Description of Related Art

In this fast-changing society, wireless communication techniques are progressing at an unbelievably rapid pace and hence play an important role in data communication networks. Wireless communication is mostly conducted at very high frequency. Amongst the components used in high-frequency communication, variable capacitor (varactor for short) occupies a center stage.

In general, to change the capacitance of a variable capacitor, supply voltage to the variable capacitor is varied. When the capacitance of the varactor is changed, transmission or reception frequency of a high-frequency circuit is increased or decreased accordingly. Ultimately, wireless communication equipment containing this piece of high-frequency circuit is able to receive or transmit communication signals more accurately.

In the fabrication of high-frequency circuits, the metal-oxide semiconductor (MOS) devices and bipolar complementary metal-oxide-semiconductor (BiCMOS) devices are formed before the variable capacitor.

FIG. 6 is a schematic cross-sectional view of a conventional variable capacitor. In the conventional method of fabricating a variable capacitor, a substrate 10 having $N^+$ buried layer 12 on top, an N-well 14 above the buried layer 12, a deep collector region 20 also above the buried layer 12 and a field oxide layer 16 above the substrate 10 is provided. P-type ions are next implanted into the N-well 14 to form a $P^+$-doped region 18 near the surface of the N-well 14. Thereafter, metal silicide layers 22 and 24 are formed over the $P^+$-doped region 18 and the deep collector region 20 respectively. A dielectric layer 26 is formed over the substrate 10. Contacts 28 and 30 are formed in the dielectric layer 26 in contact with the metal silicide layers 22 and 24 respectively. Up to this stage, a variable capacitor structure comprising of the deep collector 20, the $N^+$ buried layer 12 and the N-well 14/$P^+$-doped region 18 is established.

Since the quality factor (Q) of the variable capacitor is inversely proportional to its resistance and capacitance and the capacitance value is the required capacitance of this variable capacitor, the quality factor of the variable capacitor can be improved only by lowering the resistance of the variable capacitor. However, in a conventional variable capacitor structure, the resistance of the variable capacitor is largely affected by the high resistance of the N-well 14. Since resistance at the N-well 14 is difficult to reduce, further improvement in the operating efficiency of a variable capacitor is hard to come by.

SUMMARY OF THE INVENTION

Accordingly, one object of the present invention is to provide a variable capacitor or varactor having a considerably smaller resistance.

A second object of the invention is to provide a variable capacitor or varactor whose circuit layer requires a smaller space.

To achieve these and other advantages and in accordance with the purpose of the invention, as embodied and broadly described herein, the invention provides a variable capacitor structure. The variable capacitor includes a substrate, a first type ion-doped buried layer, a first type ion-doped well, a second type ion-doped region and a conductive layer. The first type ion-doped well is buried within the substrate. The first type ion-doped well also has a cavity section. The first type ion-doped buried layer is formed underneath and in direct contact with the first type well. The second type ion-doped region is formed within the cavity section of the first type ion-doped well. The conductive layer is formed above and in contact with the first type ion-doped buried layer.

This invention also provides an alternative variable capacitor structure. The variable capacitor includes a substrate, a first type ion-doped buried layer, a first type ion-doped well, at least one second type ion-doped region and at least one conductive layer. The substrate has at least a shallow trench isolation (STI) structure. The first type ion-doped well is buried within the substrate. The first type ion-doped buried layer is formed underneath the first type ion-doped well within the substrate. The first type ion-doped buried layer is in direct contact with the first type ion-doped well. The second type ion-doped region is formed underneath the shallow trench isolation structure within the first type ion-doped well. The conductive layer connects with the first type ion-doped buried layer.

This invention also provides a method of forming a variable capacitor. A substrate having a first type ion-doped buried layer and a first type ion-doped well region above and in contact with the first type ion-doped buried layer is provided. A portion of the first type ion-doped well is removed to form at least one opening without exposing the first type ion-doped buried layer. A second type ion-doped region is formed in the first type ion-doped well at the bottom of the opening.

This invention also provides an alternative method of forming a variable capacitor. A substrate having a first type ion-doped buried layer and a first type ion-doped well region above and in contact with the first type ion-doped buried layer is provided. A shallow trench isolation structure is formed within the first type ion-doped well. A portion of the first type ion-doped well is removed to form an opening that exposes a portion of the first type ion-doped buried layer. A dielectric layer is formed over the substrate. Thereafter, at least one first contact opening and at least one second contact opening are formed in the dielectric layer. The first contact opening exposes a portion of the metal silicide layer and the second contact opening exposes the first type ion-doped well at the bottom section of the shallow trench isolation structure. A second type ion-doped region is formed in the first type ion-doped region at the bottom section of the shallow trench isolation structure. Contacts are formed inside the first contact opening and the second contact opening. The second type ion-doped region may also be formed within the step of forming the shallow trench isolation structure.

In this invention, resistance of the variable capacitor is reduced by shortening the overall width of the second type ion-doped well from the second type ion-doped region to the first type ion-doped buried layer.

In the manufacturing step for producing the variable capacitor, a portion of the process is carried out in tandem with the process for fabricating the bipolar devices. Hence, resistance of the variable capacitor is reduced without increasing mask requirements.

Unlike a conventional variable capacitor that requires a deep collector, contacts are directly used to make contact with the buried layer so that resistance of the variable capacitor is further reduced.

Furthermore, the doped region is formed at the bottom section of the shallow trench isolation structure to reduce overall volume occupation of the circuit layout.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
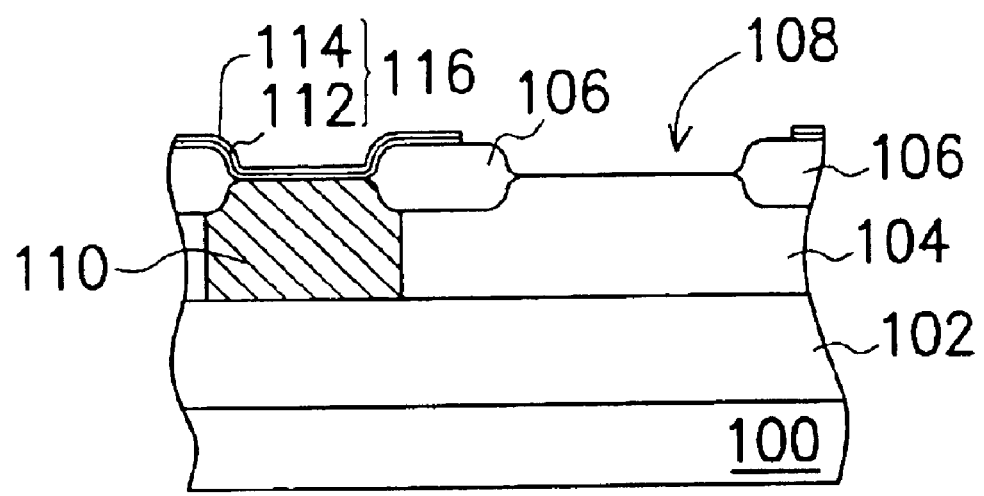
FIGS. 1A to 1D are schematic cross-sectional views showing the progression of steps for producing a variable capacitor according to a first preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A to 1D are schematic cross-sectional views showing the progression of steps for producing a variable capacitor according to a first preferred embodiment of this invention. As shown in FIG. 1A, a substrate 100 having an $N^+$ buried layer 102, an N-well 104, a field oxide layer 106 and a deep collector 110 is provided. The N-well 104 and the deep collector 110 are formed over the $N^+$ buried layer 102. The field oxide layer 106 is formed between the N-well 104 and the deep collector 110. The $N^+$ buried layer 102 is a heavily doped region using, for example, phosphorus dopants. The deep collector 110 is also a heavily doped region using, for example, boron dopants. In the aforementioned structure, the oxide layer 106 is used as a device isolation structure. However, a shallow trench isolation structure may also be employed.

A passivation layer 116 is formed over the substrate 100. Thereafter, photolithographic and etching processes are conducted to remove a portion of the passivation layer and form an opening 108 that exposes a portion of the N-well 104. The passivation layer 116 is formed, for example, by sequentially forming an oxide layer 112 and a nitride layer 114 in chemical vapor deposition. However, the opening 108 in the passivation layer 116 may also be formed in the same step as forming the bipolar openings in the bipolar process of fabricating the bipolar complementary metal-oxide-semiconductor (BiCMOS) devices. Since the opening 108 is formed in the same step as forming the bipolar opening, no additional mask is required. Hence, some production time and production cost is saved.

Figure 1B:
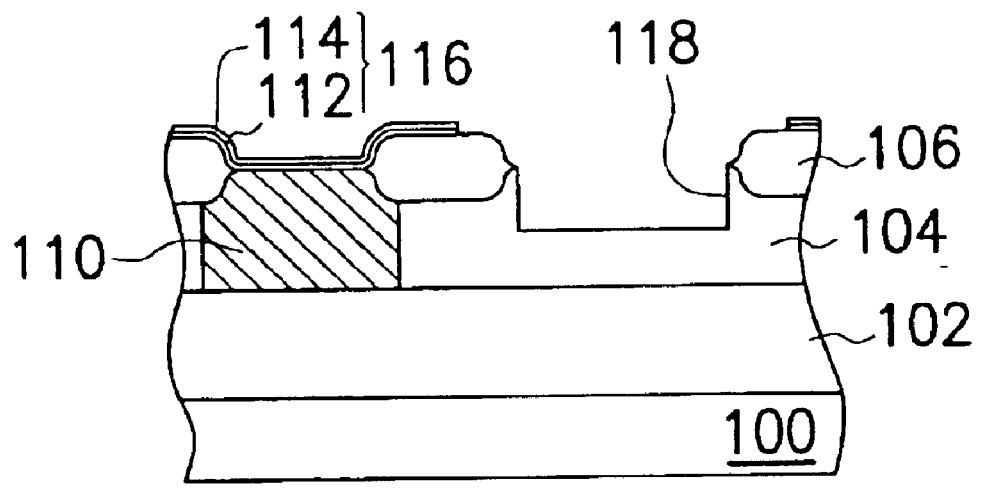

As shown in FIG. 1B, using the passivation layer 116 as a mask, a portion of the N-well 104 is removed to form an opening 118 that exposes a region outside the $N^+$ buried layer 102. Alternatively, the base polysilicon etching time in the bipolar process is extended to form the opening 118. Since no extra etching step needs to be performed, both production time and production cost are reduced.

Figure 1C:
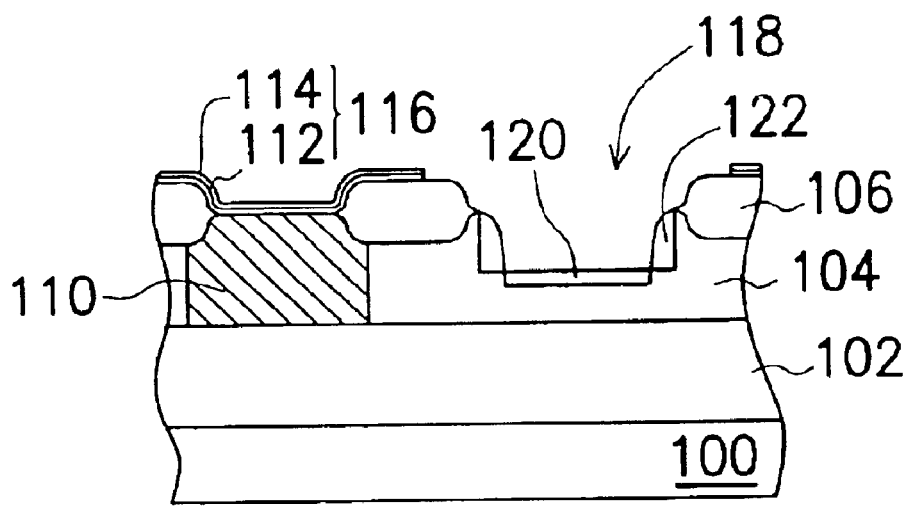

As shown in FIG. 1C, a spacer 122 is formed on each sidewall of the opening 118. The spacers 122 are formed, for example, by conducting a chemical vapor deposition to form an oxide layer over the substrate 100 and then performing an anisotropic etching operation to remove a portion of the oxide layer. The spacers 122 prevent the formation of unwanted doping region in the N-well 104 close to the opening sidewall due to a rough contour at the sidewalls of the opening 118 after conducting an ion implantation.

Although silicon oxide spacers 122 are used in the illustration, silicon nitride is also a suitable candidate material for forming the spacers. Moreover, if the opening 118 has smooth and vertical sidewalls, there is no need to form the spacers.

Using the spacers 122, the passivation layer 116 and the field oxide layer 106 as a mask, a P-type ion implantation is carried out to form a $P^+$-doped region 120 at the bottom of the opening 118. The P-type ions include, for example, boron ions.

Figure 1D:
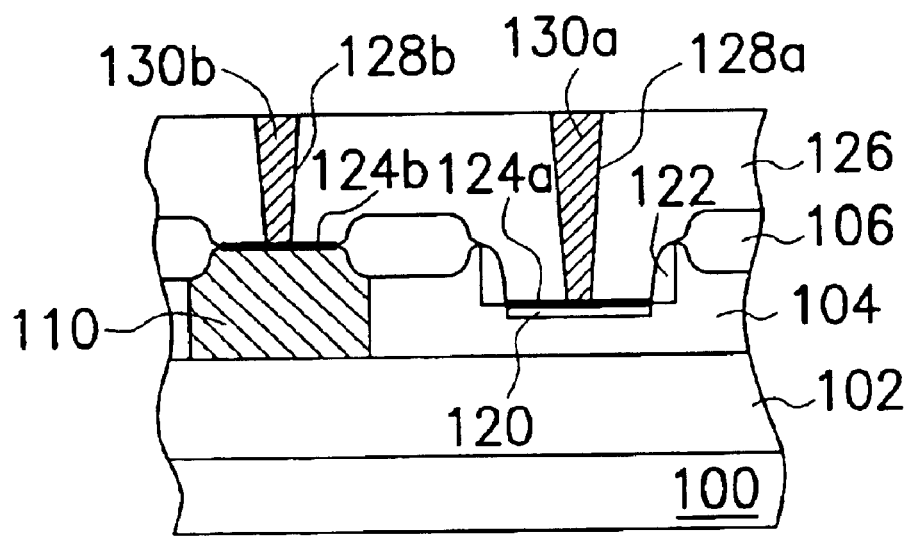

As shown in FIG. 1D, the passivation layer 116 is removed. Metal silicide layers 124a and 124b are formed over the upper surface of the $P^+$-doped region 120 and the deep collector 110 respectively. The metal silicide layers 124a and 124b are formed, for example, by depositing titanium over the substrate 100, then conducting an annealing operation so that titanium in the titanium layer and silicon in the substrate 100 react to form silicide, and finally removing the unreacted titanium. The metal silicide layers 124a and 124b are, for example, titanium silicide layers.

A dielectric layer 126 is formed over the substrate 100. A portion of the dielectric layer 126 is removed to form openings 128a and 128b by conducting photolithographic and etching processes. The openings 128a and 128b expose a portion of the respective metal silicide layers 124a and 124b. Metallic material is deposited to fill the openings 128a and 128b. A chemical-mechanical polishing operation is conducted to planarize the metallic layer, thereby forming contacts 130a and 130b inside the openings 128a and 128b respectively. Metallic material for filling the openings 128a and 128b includes, for example, tungsten.

In the first embodiment, the $P^+$-doped region 120 is formed at the bottom of the opening 118. Hence, the thickness from the $P^+$-doped region 120 to the $N^+$ buried layer 102 is reduced. Ultimately, overall resistance of the variable capacitor decreases considerably.

In addition, a portion of the fabricating step may combine with the bipolar manufacturing processes. Hence, the total number of masks in manufacturing the variable capacitor in this invention is identical to a conventional process. In other words, the manufacturing process is able to reduce the resistance of a variable capacitor without any increase in the number of required masks.

Furthermore, the variable capacitor comprises a P$^+$-doped region, a N$^+$ buried layer and a P-type deep collector. However, other arrangements are also possible such as an N$^+$-doped region, a P$^+$ buried layer and an N-type deep collector.

Figure 2A:
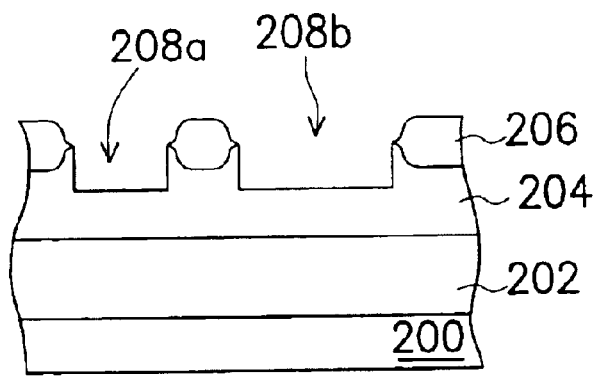
FIGS. 2A to 2E are schematic cross-sectional views showing the progression of steps for producing a variable capacitor according to a second preferred embodiment of this invention.

FIGS. 2A to 2E are schematic cross-sectional views showing the progression of steps for producing a variable capacitor according to a second preferred embodiment of this invention. As shown in FIG. 2A, a substrate 200 having an N$^+$ buried layer 202, an N-well 204 and a field oxide layer 206 is provided. The N-well 204 is formed over the N$^+$ buried layer 202. The field oxide layer 206 is formed above the N-well 204. The N$^+$ buried layer 202 is a heavily doped region using, for example, phosphorus dopants. The N-well 204 is also a lightly doped region of phosphorus dopants. In the aforementioned structure, the oxide layer 206 is used as a device isolation structure. However, a shallow trench isolation structure may also be employed.

Photolithographic and etching processes are carried out to remove a portion of the N-well 204 and form openings 208a and 208b without exposing the underlying N$^+$ buried layer 202. In this embodiment, the openings 208a and 208b are formed, for example, over two active device regions each isolated from the other by the field oxide layer 206. The openings 208a and 208b are also formed through an extension of the base polysilicon etching time in the bipolar process. If the openings 208a and 208b are formed through an extension of the etching time in the bipolar process, no extra etching step is required and some production time is saved.

Figure 2B:
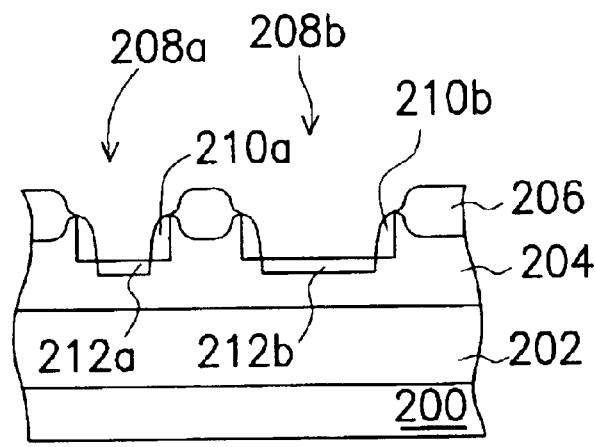

As shown in FIG. 2B, spacers 210a and 210b are formed on the sidewalls of the openings 208a and 208b respectively. The spacers 210a and 210b are formed, for example, by forming a silicon oxide layer over the substrate 200 in a chemical vapor deposition and removing a portion of the oxide layer in an anisotropic etching. The spacers 210a and 210b prevent the formation of unwanted doping region in the N-well 204 close to the opening sidewalls due to a rough contour at the sidewalls of the openings 208a and 208b after conducting an ion implantation.

Although silicon oxide spacers 210a and 210b are used in the illustration, silicon nitride is also a suitable candidate material for forming the spacers. Moreover, if the openings 208a and 208b have smooth and vertical sidewalls, there is no need to form the spacers.

Using the spacers (210a and 210b) and the field oxide layer 206 as a mask, a P-type ion implantation is carried out to form P$^+$-doped regions 212a and 212b at the bottom of the openings in the N-well 204. The P-type ions include, for example, boron ions.

Figure 2C:
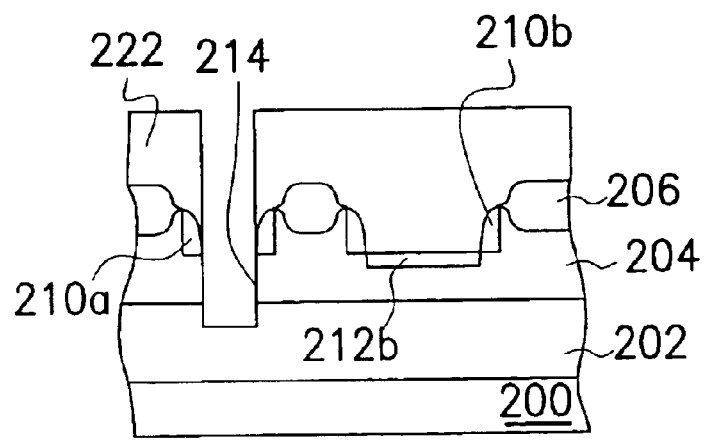

As shown in FIG. 2C, a photoresist layer 222 that exposes the P$^+$-doped region 212a is formed over the substrate 200. Using the photoresist layer 222 as a mask, the N-well 204 is etched to form an opening 214 that exposes a portion of the N$^+$ buried layer 202. The N-well may be slightly over-etched to prevent any residual N-well material from adhering to the bottom of the opening 214. Furthermore, the spacers 210a may also serve as a mask in the etching process even if the photoresist layer 222 is slightly misaligned.

Figure 2D:
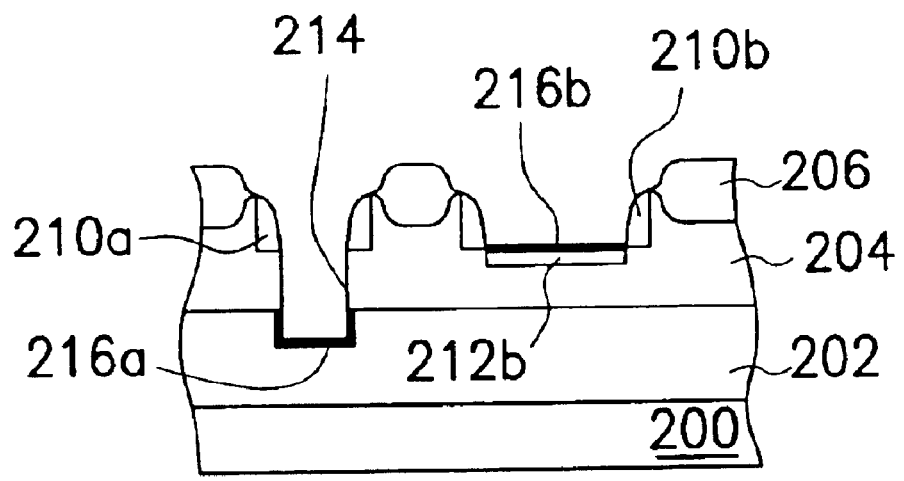

As shown in FIG. 2D, the photoresist layer 222 is removed. Metal silicide layers 216a and 216b are formed over the exposed N$^+$ buried layer 202 and the P$^+$-doped region 212b. The metal silicide layers 216a and 216b are formed, for example, by depositing titanium over the substrate 200, then conducting an annealing operation so that titanium in the titanium layer and silicon in the substrate 200 react to form silicide, and finally removing the unreacted titanium. The metal silicide layers 216a and 216b are, for example, titanium silicide layers.

Figure 2E:
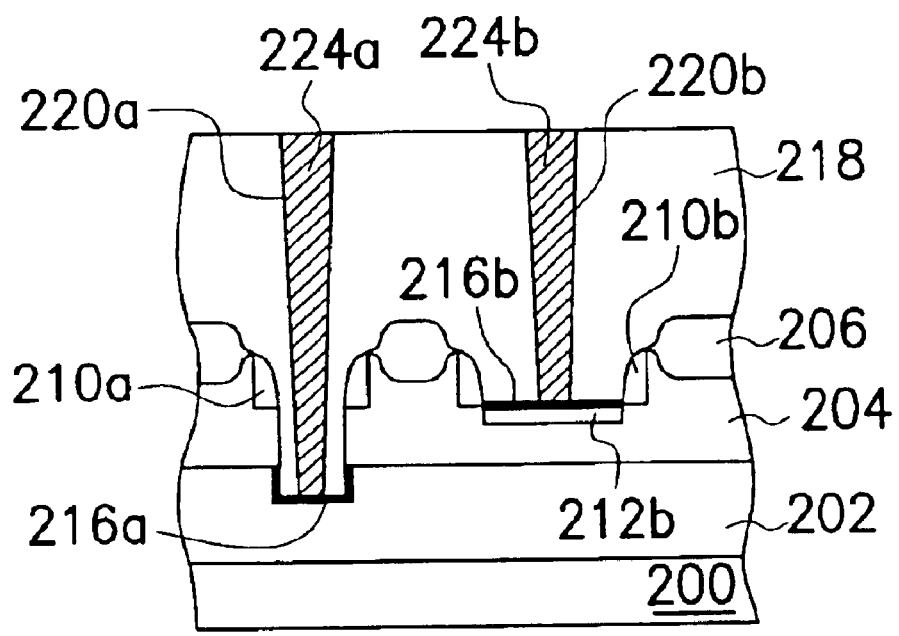

As shown in FIG. 2E, a dielectric layer 218 is formed over the substrate 200. A portion of the dielectric layer 218 is removed to form openings by conducting photolithographic and etching processes. The openings expose a portion of the respective metal silicide layers 216a and 216b. Metallic material is deposited to fill the openings 224a and 224b. A chemical-mechanical polishing operation is conducted to planarize the metallic layer, thereby forming contacts 224a and 224b. Metallic material for forming the contacts 224a and 224b includes, for example, tungsten.

Unlike a conventional variable capacitor that requires a deep collector to connect with the N$^+$ buried layer, the contacts directly contact with the N$^+$ buried layer. Because the contact is made from low resistant metallic material while the conventional deep collector is made from doped silicon, resistivity of the deep collector is considerably higher than the contact. In this invention, the buried layer 202 is connected through the contact 224. Consequently, resistance of the variable capacitor is further reduced and the quality factor of the variable capacitor is increased.

In the second embodiment, the P$^+$-doped region 212b is formed in the N-well 204 at the bottom of the opening 208b. Hence, the distance from the P$^+$-doped region 212b to the N$^+$ buried layer 202 is reduced. Ultimately, overall resistance of the variable capacitor decreases considerably.

Furthermore, a portion of the fabricating step may combine with the bipolar manufacturing processes. Hence, the total number of masks in manufacturing the variable capacitor in this invention is identical to a conventional process. In other words, the manufacturing process is able to reduce the resistance of a variable capacitor without any increase in the number of required masks.

Although the variable capacitor comprises a P$^+$-doped region and a N$^+$ buried layer, other arrangements are also possible, such as an N$^+$-doped region and a P$^+$ buried layer.

Figure 3A:
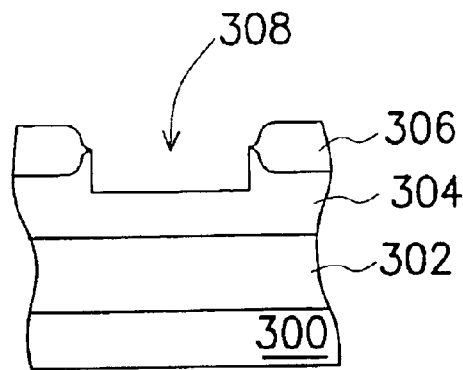
FIGS. 3A to 3F are schematic cross-sectional views showing the progression of steps for producing a variable capacitor according to a third preferred embodiment of this invention.

FIGS. 3A to 3F are schematic cross-sectional views showing the progression of steps for producing a variable capacitor according to a third preferred embodiment of this invention. As shown in FIG. 3A, a substrate 300 having an N$^+$ buried layer 302, an N-well 304 and a field oxide layer 306 is provided. The N-well 304 is formed over the N$^+$ buried layer 302. The field oxide layer 306 is formed above the N-well 304. The N$^+$ buried layer 302 is a heavily doped region using, for example, phosphorus dopants. The N-well 304 is also a lightly doped region of phosphorus dopants. In the aforementioned structure, the oxide layer 306 is used as a device isolation structure. However, a shallow trench isolation structure may also be employed.

Photolithographic and etching processes are carried out to remove a portion of the N-well 304 and form an opening 308 without exposing the underlying N$^+$ buried layer 302. The opening 308 may also be formed through an extension of the base polysilicon etching time in the bipolar process. If the opening 308 is formed through an extension of the etching time in the bipolar process, no extra etching step is required and some production time is saved.

Figure 3B:
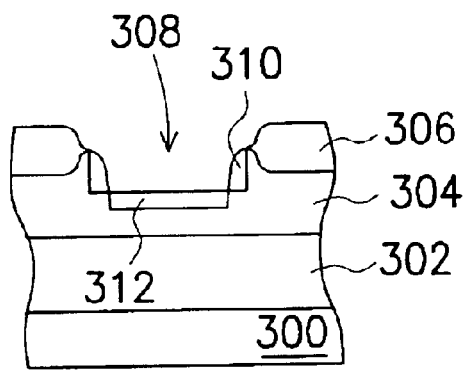

As shown in FIG. 3B, a first spacer 310 is formed on the sidewalls of the opening 308. The first spacer 310 is formed, for example, by forming a silicon oxide layer over the substrate 300 in a chemical vapor deposition and removing a portion of the oxide layer in an anisotropic etching. The first spacer 310 prevents the formation of unwanted doping region in the N-well 304 close to opening sidewalls due to a rough contour at the sidewalls of the opening 308 after conducting an ion implantation.

Although silicon oxide spacers 310 are used in the illustration, silicon nitride is also a suitable candidate material for forming the spacers. Moreover, if the opening 308 has smooth and vertical sidewalls, there is no need to form the spacers.

Using the first spacers 310 and the field oxide layer 306 as a mask, a P-type ion implantation is carried out to form a P+-doped region 312 at the bottom of the opening in the N-well 304. The P-type ions include, for example, boron ions.

Figure 3C:
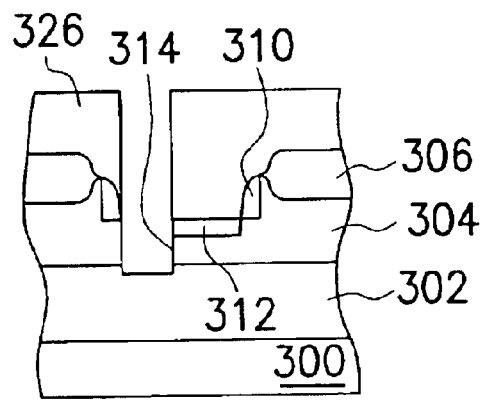

As shown in FIG. 3C, a photoresist layer 326 that exposes the P+-doped region 312 is formed over the substrate 300. Using the photoresist layer 326 as a mask, the N-well 304 is etched to form an opening 314 that exposes a portion of the N+ buried layer 302. The N-well 304 may be slightly over-etched to prevent any residual N-well material from adhering to the bottom of the opening 314.

Figure 3D:
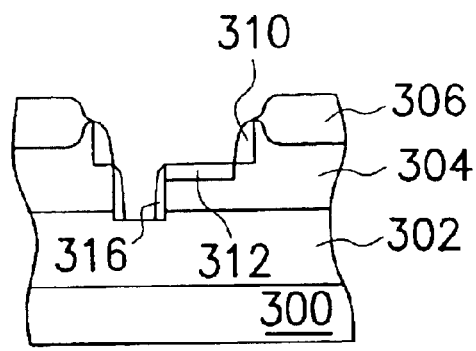

As shown in FIG. 3D, the photoresist layer 326 is removed. A second spacer 316 is formed on each sidewall of the opening 314. The second spacer 316 is formed, for example, by forming a silicon oxide layer over the substrate 300 in a chemical vapor deposition and removing a portion of the oxide layer in an anisotropic etching.

Figure 3E:
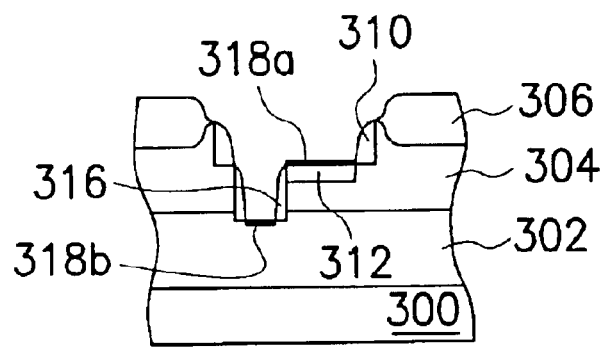

As shown in FIG. 3E, metal silicide layers 318a and 318b are formed over the exposed N+ buried layer 302 and the P+-doped region 312 respectively. The metal silicide layers 318a and 318b are formed, for example, by depositing titanium over the substrate 300, then conducting an annealing operation so that titanium in the titanium layer and silicon in the substrate 300 react to form silicide, and finally removing the unreacted titanium. The metal silicide layers 318a and 318b are, for example, titanium silicide layers.

Figure 3F:
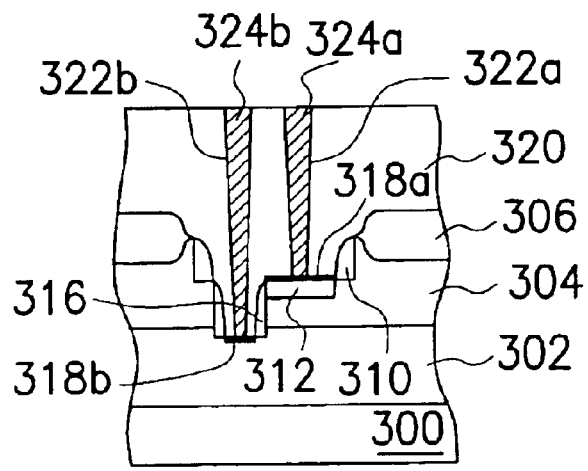

As shown in FIG. 3F, a dielectric layer 320 is formed over the substrate 300. A portion of the dielectric layer 320 is removed to form openings 322a and 322b by conducting photolithographic and etching processes. The openings 322a and 322b expose a portion of the respective metal silicide layers 318a and 318b. Metallic material is deposited to fill the openings 322a and 322b. A chemical-mechanical polishing operation is conducted to planarize the metallic layer, thereby forming contacts 324a and 324b. Metallic material for forming the contacts 324a and 324b includes, for example, tungsten.

In the third embodiment, the initial and final points of the variable capacitor are formed in the same active area. Hence, overall layout area of the capacitor is reduced.

Unlike a conventional variable capacitor that requires a deep collector to connect with the N+ buried layer, the contacts directly contact with the N+ buried layer. Because the contact is made from low resistant metallic material while a conventional deep collector is made from doped silicon, resistivity of the deep collector is considerably higher than the contact. In this invention, the buried layer 302 is connected through the contact 324b. Consequently, resistance of the variable capacitor is further reduced and the quality factor of the variable capacitor is increased.

In addition, the P+-doped region 312 is formed in the N-well 304 at the bottom of the opening 308. Hence, the distance from the P+-doped region 312 to the N+ buried layer 302 is reduced. Ultimately, overall resistance of the variable capacitor decreases considerably.

Furthermore, a portion of the fabricating step may combine with the bipolar manufacturing processes. Hence, the total number of masks in manufacturing the variable capacitor in this invention is identical to a conventional process. In other words, the manufacturing process is able to reduce the resistance of a variable capacitor without any increase in the number of required masks.

Although the variable capacitor comprises of a P+-doped region and an N+ buried layer, other arrangements are also possible such as an N+-doped region and a P+ buried layer.

Figure 4A:
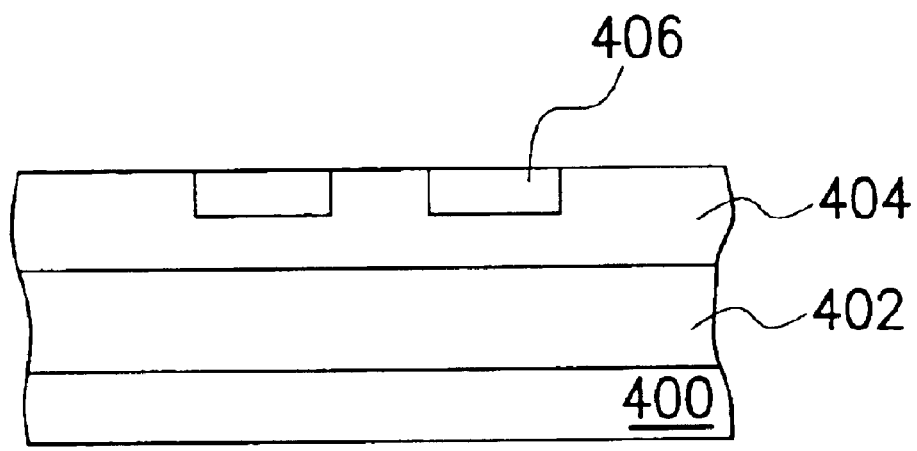
FIGS. 4A to 4G are schematic cross-sectional views showing the progression of steps for producing a variable capacitor according to a fourth preferred embodiment of this invention.

FIGS. 4A to 4G are schematic cross-sectional views showing the progression of steps for producing a variable capacitor according to a fourth preferred embodiment of this invention. As shown in FIG. 4A, a substrate 400 having an N+ buried layer 402, an N-well 404 and a shallow trench isolation structure 406 is provided. The N-well 404 is formed over the N+ buried layer 402. The shallow trench isolation structure 406 is formed above the N-well 404. The N+ buried layer 402 is a region heavily doped using, for example, phosphorus dopants. The N-well 404 is also a lightly doped region of phosphorus dopants.

Figure 4B:
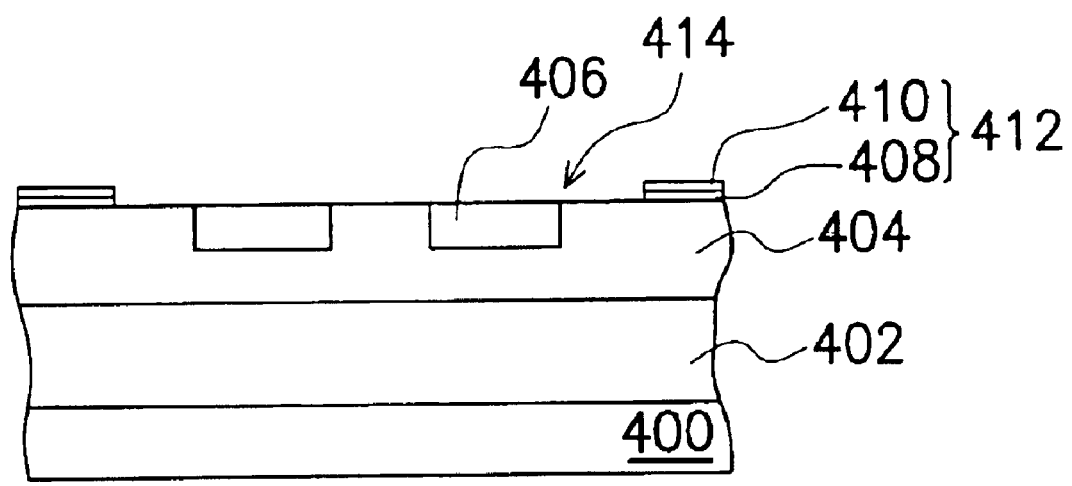

As shown in FIG. 4B, a passivation layer 412 is formed over the substrate 400. Thereafter, photolithographic and etching processes are conducted to remove a portion of the passivation layer 412 and form an opening 414 that exposes a portion of the N-well 404. The passivation layer 412 is formed, for example, by sequentially forming an oxide layer 408 and a nitride layer 410 over the substrate 400 in chemical vapor deposition. However, the opening 414 in the passivation layer 412 may also be formed in the same step as forming the bipolar openings in the bipolar process of fabricating the bipolar complementary metal-oxide-semiconductor (BiCMOS) devices. Since the opening 414 is formed in the same step as forming the bipolar opening, no additional mask is required. Hence, some production time and production cost is saved.

Figure 4C:
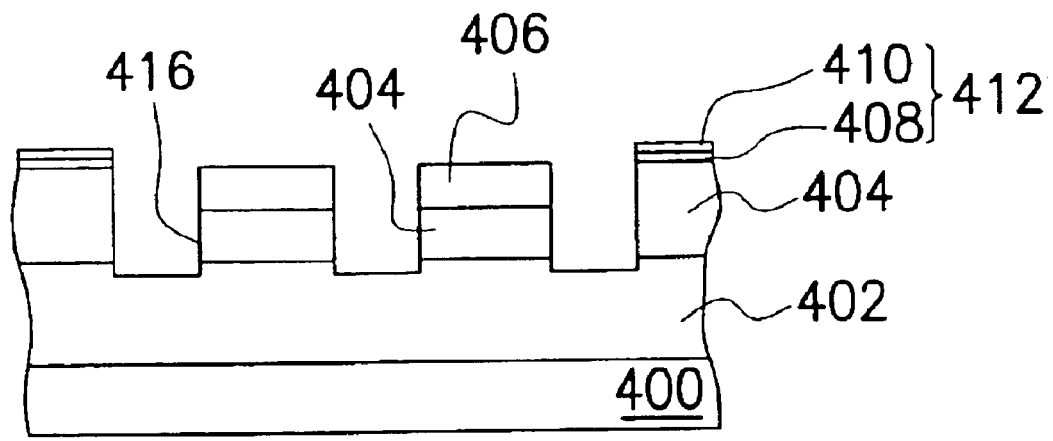

As shown in FIG. 4C, using the passivation layer 412 and the shallow trench isolation structure 406 as a mask, a portion of the N-well 404 is removed to form an opening 416 that exposes the N+ buried layer 402. Alternatively, the base polysilicon etching time in the bipolar process is extended to form the opening 416. Since no extra etching step needs to be performed, both production time and production cost are reduced.

Figure 4D:
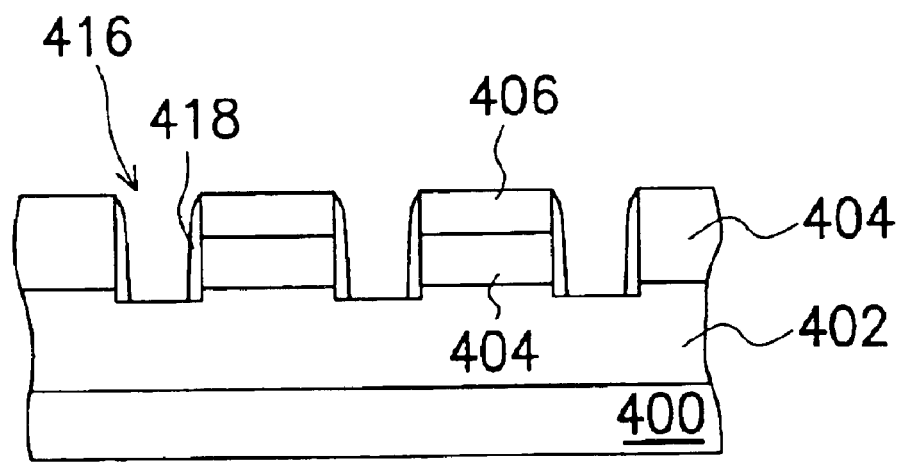

As shown in FIG. 4D, the passivation layer 412 is removed. A spacer 418 is formed on each sidewall of the opening 416. The spacers 418 are formed, for example, by conducting a chemical vapor deposition to form an oxide layer over the substrate 400 and then performing an anisotropic etching operation to remove a portion of the oxide layer. Although the spacers 418 are made from silicon oxide, other material such as silicon nitride may also be used. In addition, the passivation layer 412 may also be removed in the step of removing oxide to form the spacers 418.

Figure 4E:
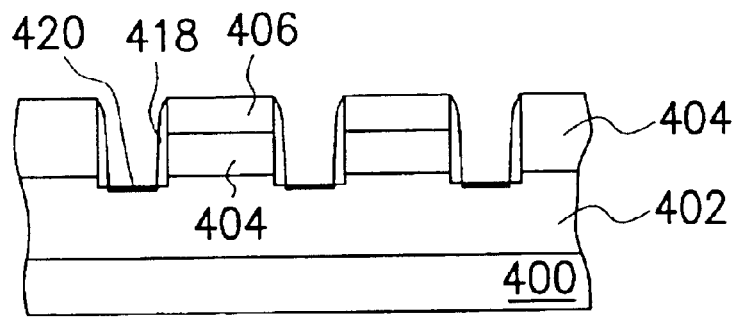

As shown in FIG. 4E, a metal silicide layer 420 is formed over the N+ buried layer 402. The metal silicide layer 420 is formed., for example, by depositing titanium over the substrate 400, then conducting an annealing operation so that titanium in the titanium layer and silicon in the substrate 400 react to form silicide, and finally removing the unreacted titanium. The metal silicide layer 420 is, for example, a titanium silicide layer.

Figure 4F:
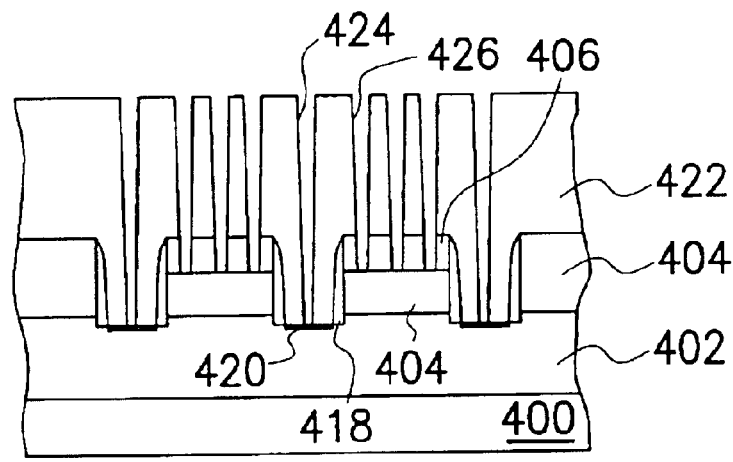

As shown in FIG. 4F, a dielectric layer 422 is formed over the substrate. Photolithographic and etching processes are conducted to remove a portion of the dielectric layer 422 and form openings 424 and 426 in the dielectric layer 422. The opening 424 exposes a portion of the metal silicide layer 420 while the opening 426 passes through the shallow trench isolation structure 406 and exposes the N-well 404 at the bottom of the shallow trench isolation structure 406.

Figure 4G:
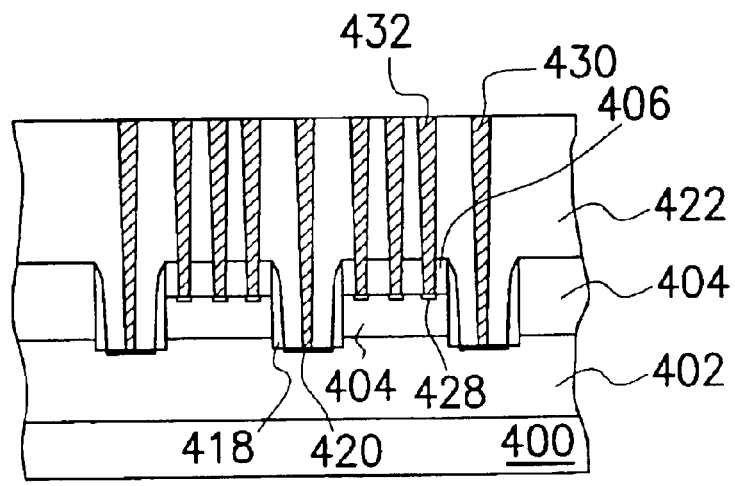

As shown in FIG. 4G, a $P^+$-doped region 428 is formed in the exposed N-well 404 using P-type ions such as boron ions. In addition, overall area of the $P^+$-doped region 428 at the bottom of the shallow trench isolation structure 406 may be increased through an increase in the number of openings 426 so that overall resistance of the variable capacitor is further reduced.

The openings 424 and 426 are back-filled with metallic material to form contacts 430 and 432 in the dielectric layer 422. The contacts 430 and 432 are made from tungsten, for example.

In the fourth embodiment, the $P^+$-doped region 428 is formed at the bottom of the shallow trench isolation structure 406. Hence, the spatial requirement of the circuit is reduced.

By forming the $P^+$-doped region 428 at the bottom of the shallow trench isolation structure 406, thickness of the high resistance N-well 404 between the $P^+$-doped region 428 and the $N^+$ buried layer 402 is shortened. Hence, resistance of the variable capacitor is greatly reduced.

Unlike a conventional variable capacitor that requires a deep collector to connect with the $N^+$ buried layer, the contacts directly contact with the $N^+$ buried layer. Because the contact is made from low resistant metallic material while the conventional deep collector is made from doped silicon, resistivity of the deep collector is considerably higher than the contact. In this invention, the buried layer 402 is connected through the contact 430. Consequently, resistance of the variable capacitor is further reduced and the quality factor of the variable capacitor is increased.

Note that although the variable capacitor of this embodiment has a $P^+$-doped region and an $N^+$ buried layer, other arrangements are also possible such as an $N^+$-doped region and a $P^+$ buried layer.

Figure 5A:
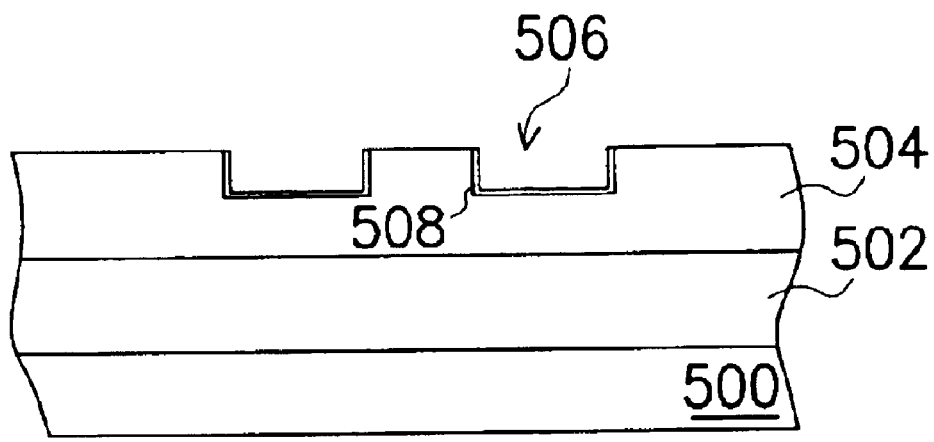
FIGS. 5A to 5H are schematic cross-sectional views showing the progression of steps for producing a variable capacitor according to a fifth preferred embodiment of this invention.

FIGS. 5A to 5H are schematic cross-sectional views showing the progression of steps for producing a variable capacitor according to a fifth preferred embodiment of this invention. As shown in FIG. 5A, a substrate 500 having an $N^+$ buried layer 502, an N-well 504 and a shallow trench isolation opening 506 is provided. The N-well 504 is formed over the $N^+$ buried layer 502. The shallow trench isolation opening 506 is formed over the N-well 504. The $N^+$ buried layer 502 is a heavily doped region using, for example, phosphorus dopants. The N-well 504 is also a lightly doped region of phosphorus dopants.

Figure 5B:
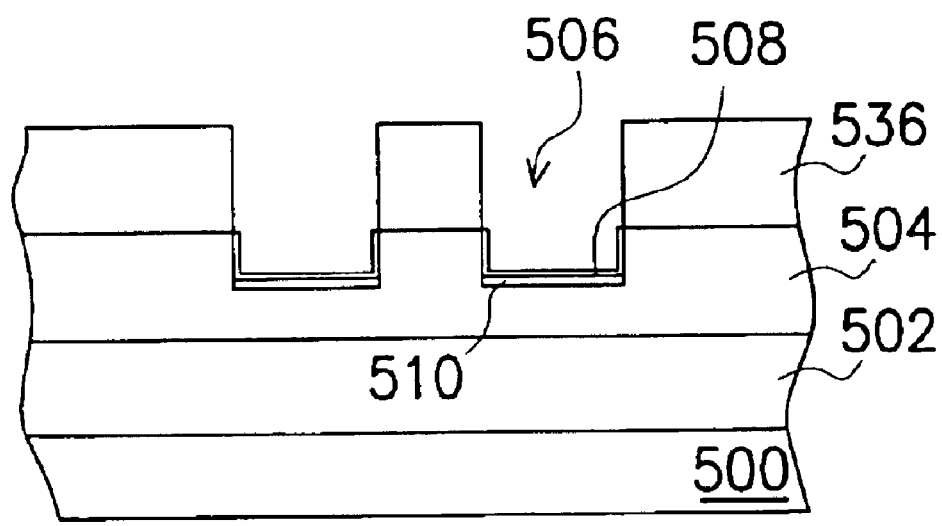

As shown in FIG. 5B, a liner layer 508 and a photoresist layer 536 that exposes the shallow trench isolation opening 506 are sequentially formed over the substrate 500. Using the photoresist layer 536 as a mask, a P-type ion implantation is carried out to form a $P^+$-doped region 510 in the N-well 504 at the bottom of the shallow trench isolation opening 506. The P-type ions can be boron ions and the liner layer 508 can be an oxide layer or a nitride layer, for example.

Alternatively, before forming the liner layer 508, the photoresist layer 536 that exposes the shallow trench isolation opening 506 is formed. Thereafter, using the photoresist layer 536 as a mask, the P-type ion implantation is carried out to form the $P^+$-doped region 510 in the N-well 504 at the bottom of the shallow trench isolation opening 506.

Figure 5C:
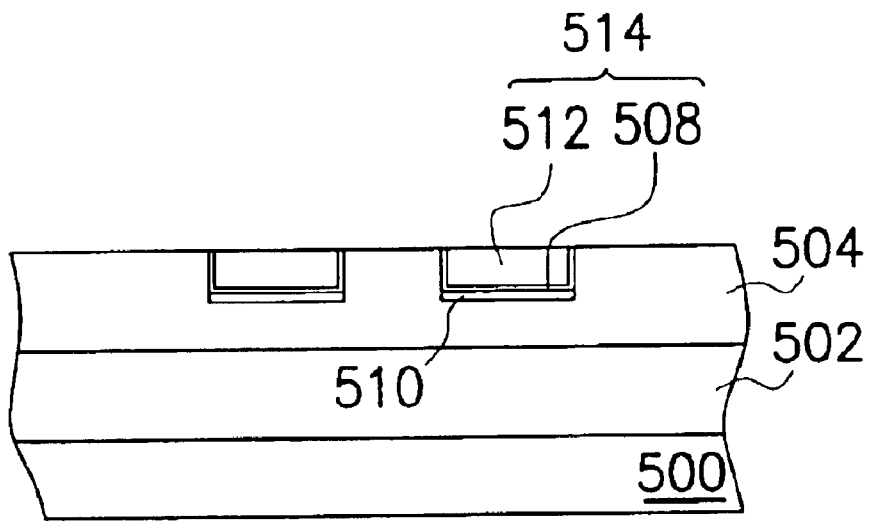

As shown in FIG. 5C, the photoresist layer 536 is removed. An insulating material is deposited into the shallow trench isolation opening 506 to form an insulation layer 512. The liner layer 508 and the insulation layer 512 together constitute a shallow trench isolation structure 514. The insulating material for forming the insulation layer 512 includes silicon oxide or silicon nitride, for example. Although the liner layer 508 is formed in the illustration of the embodiment, the liner layer 508 is not absolutely necessary in the shallow trench isolation structure 514.

Figure 5D:
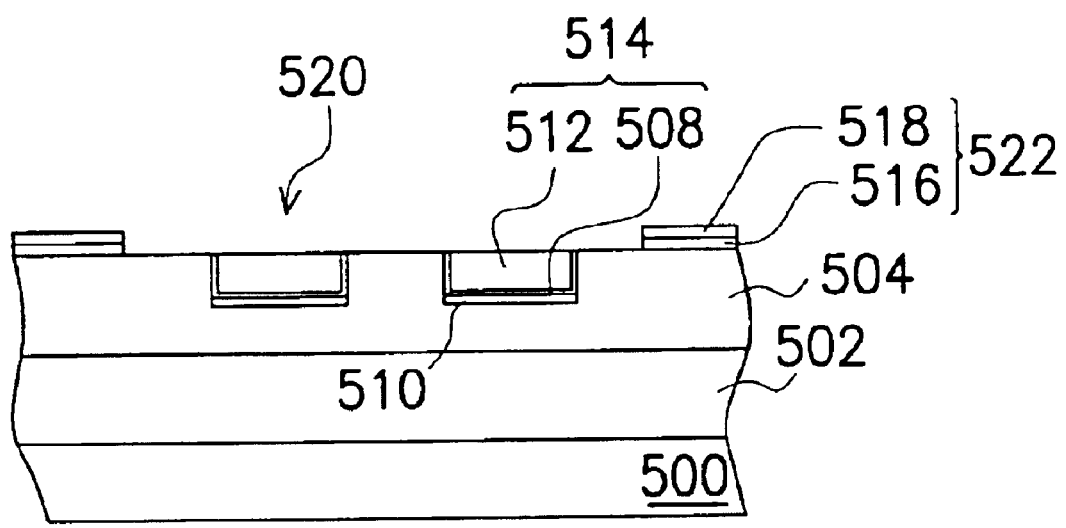

As shown in FIG. 5D, a passivation layer 522 is formed over the substrate 500. Thereafter, photolithographic and etching processes are conducted to remove a portion of the passivation layer 522 and form an opening 520 that exposes a portion of the N-well 504 and the shallow trench isolation structure 514. The passivation layer 522 is formed, for example, by sequentially forming an oxide layer 516 and a nitride layer 518 over the substrate 500 in chemical vapor deposition. However, the opening 520 in the passivation layer 522 may also be formed in the same step as forming the bipolar openings in the bipolar process of fabricating the bipolar complementary metal-oxide-semiconductor (BiCMOS) devices. Since the opening 520 is formed in the same step as forming the bipolar opening, no additional mask is required. Hence, some production time and production cost is saved.

Figure 5E:
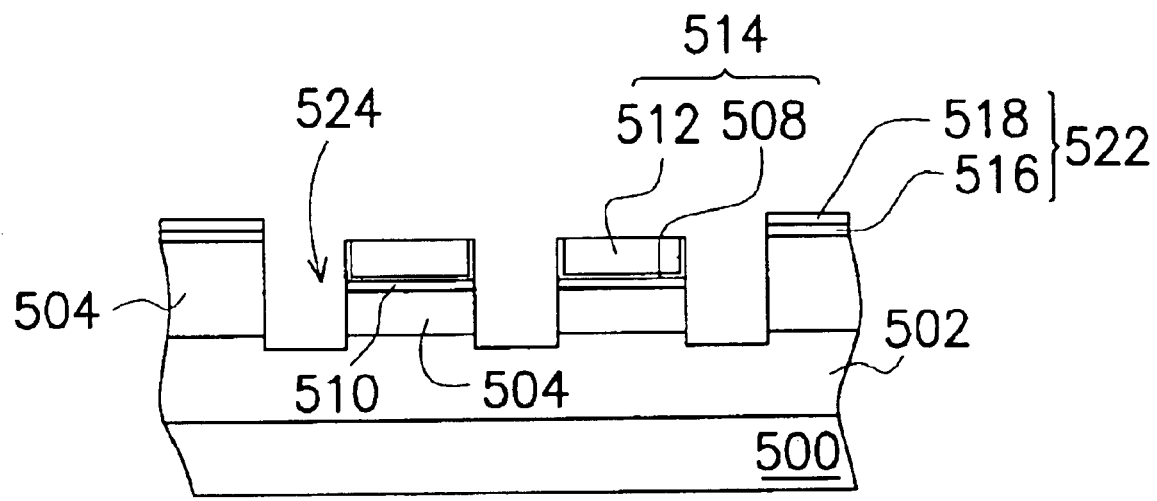

As shown in FIG. 5E, using the passivation layer 522 and the shallow trench isolation structure 512 as a mask, a portion of the N-well 504 is removed to form an opening 524 that exposes the $N^+$ buried layer 502. Alternatively, the base polysilicon etching time in the bipolar process is extended to form the opening 524. Since no extra etching step needs to be performed, both production time and production cost are reduced.

Figure 5F:
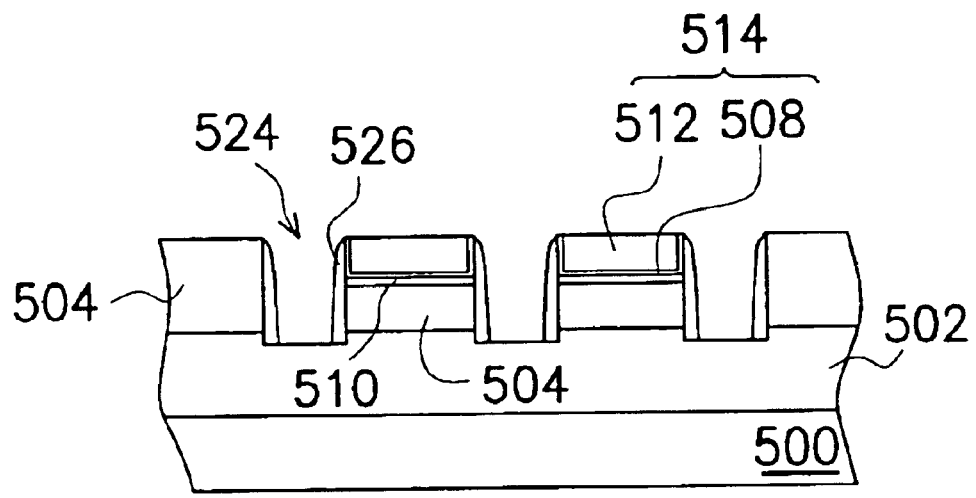

As shown in FIG. 5F, the passivation layer 522 is removed. A spacer 526 is formed on each sidewall of the opening 524. The spacers 526 are formed, for example, by conducting a chemical vapor deposition to form an oxide layer over the substrate 500 and then performing an anisotropic etching operation to remove a portion of the oxide layer. Although the spacers 526 are made from silicon oxide, other material such as silicon nitride may also be used. In addition, the passivation layer 522 may also be removed in the step of removing oxide to form the spacers 526.

Figure 5G:
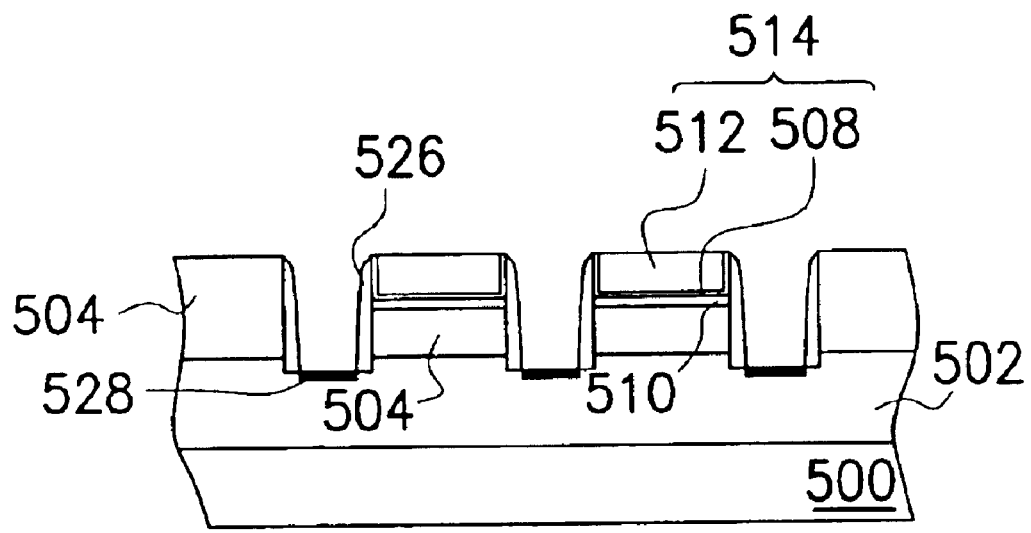

As shown in FIG. 5G, a metal silicide layer 528 is formed over the $N^+$ buried layer 502. The metal silicide layer 528 is formed, for example, by depositing titanium over the substrate 500, then conducting an annealing operation so that titanium in the titanium layer and silicon in the substrate 500 react to form silicide, and finally removing the unreacted titanium. The metal silicide layer 528, for example, is a titanium silicide layer.

Figure 5H:
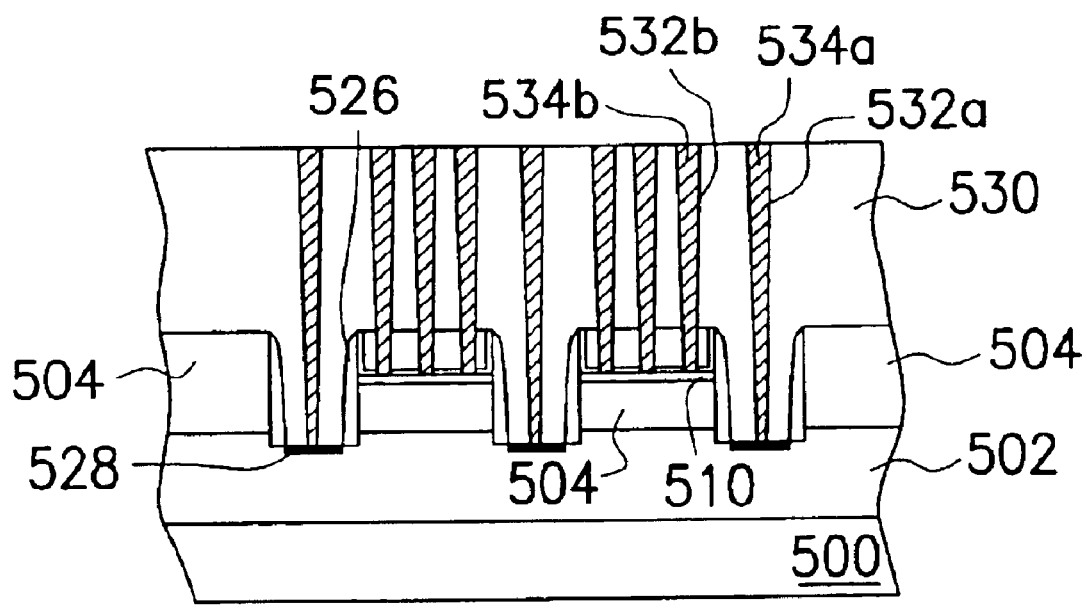
Figure 6:
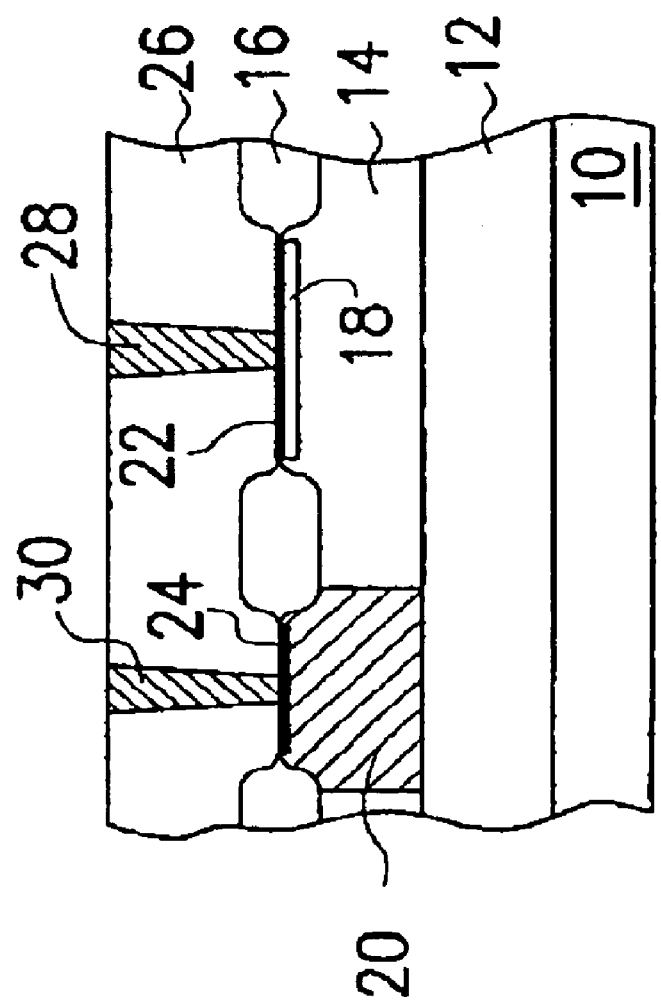
FIG. 6 is a schematic cross-sectional view of a conventional variable capacitor.

As shown in FIG. 5H, a dielectric layer 530 is formed over the substrate 500.

Photolithographic and etching processes are conducted to remove a portion of the dielectric layer 530 and form openings 532a and 532b in the dielectric layer 530. The opening 532a exposes a portion of the metal silicide layer 528 while the opening 532b passes through the shallow trench isolation structure 514 and exposes the $P^+$-doped region 510 at the bottom of the shallow trench isolation structure 514.

The openings 532a and 532b are back-filled with metallic material to form contacts 534a and 534b in the dielectric layer 530. The contacts 534a and 534b are made from tungsten, for example.

The P+-doped region 510 in the fifth embodiment is a single self-contained doped layer while the P+-doped region 428 in the fourth embodiment is constructed from a multiple of doped blocks. Thus, when the doped regions 428 and 510 above the respective shallow trench isolation structures 406 and 514 are identical in area, conductive area of the P+-doped region 510 is greater than the overall conductive area of the P+-doped region 428. Since resistance is inversely related to the conductive area, resistance of the variable capacitor is further lowered in the fifth embodiment of this invention.

Furthermore, the P+-doped region 510 is formed at the bottom of the shallow trench isolation structure 514. Hence, the spatial requirement of the circuit is reduced.

By forming the P+-doped region 510 at the bottom of the shallow trench isolation structure 514, thickness of the high resistance N-well 504 between the P+-doped region 510 and the N+ buried layer 502 is shortened. Hence, resistance of the variable capacitor is greatly reduced.

Unlike a conventional variable capacitor that requires a deep collector to connect with the N+ buried layer, the contacts directly contact with the N+ buried layer. Because the contact is made from low resistant metallic material while the conventional deep collector is made from doped silicon, resistivity of the deep collector is considerably higher than the contact. In this invention, the buried layer 502 is connected through the contact 534a. Consequently, resistance of the variable capacitor is further reduced and the quality factor of the variable capacitor is increased.

Note that although the variable capacitor of this embodiment has a P+-doped region and an N+ buried layer, other arrangements are also possible such as an N+-doped region and a P+ buried layer.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A variable capacitor structure, comprising:
   a substrate;
   a first conductivity type ion-doped well within the substrate, wherein the first conductivity type ion-doped well has a cavity;
   a first conductivity type ion-doped buried layer in the substrate underneath the first conductivity type ion-doped well, wherein the first conductivity type ion-doped buried layer and the first conductivity type ion-doped well are connected;
   a second conductivity type ion-doped region at the bottom of the cavity of the first conductivity type ion-doped well; and
   a conductive layer including a contact over the first conductivity type ion-doped buried layer, wherein the conductive layer and the first conductivity type ion-doped buried layer are connected;
   wherein the second conductivity type ion-doped region and the conductive layer are located within the same active device region of the substrate, and the conductive layer is isolated from the second conductivity type ion-doped region through an insulation layer.

2. The variable capacitor of claim 1, wherein the structure further includes a first metal silicide layer over the second conductivity type ion-doped region.

3. The variable capacitor of claim 1, wherein the conductive layer further includes a second conductivity type ion-doped deep collector region.

4. The variable capacitor of claim 3, wherein the structure further includes a second metal silicide layer over the second conductivity type ion-doped deep collector region.

5. The variable capacitor of claim 1, wherein the structure further includes a second metal silicide layer between the first conductivity type ion-doped buried layer and the conductive layer.

6. The variable capacitor of claim 1, wherein the structure further includes an isolation structure within the first conductivity type ion-doped well between the second conductivity type ion-doped region and the conductive layer.

7. The variable capacitor of claim 1, wherein the contact is isolated from the second conductivity type ion-doped region through an insulation layer.

8. The variable capacitor of claim 7, wherein the first conductivity type ion-doped buried layer has a second cavity and the conductive layer is over the second cavity of the first conductivity type ion-doped buried layer.

9. The variable capacitor of claim 8, wherein the structure further includes a second metal silicide layer on a surface of the second cavity of the first conductivity type ion-doped buried layer and between the first conductivity type ion-doped buried layer and the conductive layer.

10. A variable capacitor structure, comprising:
    a substrate;
    a first conductivity type ion-doped well within the substrate, wherein the first conductivity type ion-doped region has a shallow trench isolation structure;
    a first conductivity type ion-doped buried layer in the substrate underneath the first conductivity type ion-doped well, wherein the first conductivity type ion-doped buried layer and the first conductivity type ion-doped well are connected;
    at least one second conductivity type ion-doped region in the first conductivity type ion-doped well at the bottom of the shallow trench isolation structure; and
    at least one first conductive layer connected to the first conductivity type ion-doped buried layer.

11. The variable capacitor of claim 10, wherein the first conductivity type ion-doped buried layer is an N-type buried layer and the second conductivity type ion-doped region is a P-doped region.

12. The variable capacitor of claim 10, wherein the structure further includes at least a second conductive layer connected with the second conductivity type ion-doped region.

13. The variable capacitor of claim 10, wherein the structure further includes a metal silicide layer between the first conductivity type ion-doped buried layer and the first conductive layer.

14. A variable capacitor structure, comprising:
    a substrate;
    a first conductivity type ion-doped well within the substrate, wherein the first conductivity type ion-doped well has a cavity;
    a first conductivity type ion-doped buried layer in the substrate underneath the first conductivity type ion-doped well, wherein the first conductivity type ion-doped buried layer and the first conductivity type ion-doped well are connected;
    a second conductivity type ion-doped region at the bottom of the cavity of the first conductivity type ion-doped well; and a conductive layer including a contact over the first conductivity type ion-doped buried layer, wherein the conductive layer and the first conductivity type ion-doped buried layer are connected;

wherein the contact is isolated from the second conductivity type ion-doped region through an insulation layer, the first conductivity type ion-doped buried layer has a second cavity and the conductive layer is over the second cavity of the first conductivity type ion-doped buried layer.

* * * * *